United States Patent
Odagaki

(10) Patent No.: US 11,523,494 B2
(45) Date of Patent: Dec. 6, 2022

(54) ELECTRONIC APPARATUS IMPROVED IN HEAT DISSIPATION EFFICIENCY OF HEAT GENERATING COMPONENT

(71) Applicant: CANON KABUSHIKI KAISHA, Tokyo (JP)

(72) Inventor: Koichi Odagaki, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 16 days.

(21) Appl. No.: 17/378,854

(22) Filed: Jul. 19, 2021

(65) Prior Publication Data

US 2022/0030698 A1 Jan. 27, 2022

(30) Foreign Application Priority Data

Jul. 27, 2020 (JP) .............................. JP2020-126451

(51) Int. Cl.
*H05K 1/02* (2006.01)
*H05K 1/14* (2006.01)
*H05K 7/20* (2006.01)

(52) U.S. Cl.
CPC ......... *H05K 1/0206* (2013.01); *H05K 1/0203* (2013.01); *H05K 1/028* (2013.01);
(Continued)

(58) Field of Classification Search
CPC .. H05K 1/02–0212; H05K 1/028; H05K 1/11; H05K 1/14; H05K 1/181;
(Continued)

(56) References Cited

U.S. PATENT DOCUMENTS 5,168,430 A * 12/1992 Nitsch ................... H05K 3/361
174/268
2008/0043194 A1* 2/2008 Lin ....................... G02B 6/0085
349/149

(Continued)

FOREIGN PATENT DOCUMENTS

JP 2016-082261 A 5/2016

OTHER PUBLICATIONS

English Translation of JP2016082261A (Year: 2016).*

*Primary Examiner* — Zachary Pape
*Assistant Examiner* — Amir A Jalali
(74) *Attorney, Agent, or Firm* — Cowan, Liebowitz & Latman, P.C.

(57) ABSTRACT

An electronic apparatus that is improved in heat dissipation efficiency of a heat generating component while avoiding an increase in the size of the electronic apparatus. A first substrate has a heat generating component mounted thereon. A heat dissipation frame is arranged opposed to and in contact with a second substrate. A flexible printed circuit electrically connects the first and second substrates. A thermally conductive member is sandwiched between the heat generating component and the heat dissipation frame such that the flexible printed circuit is pressed against the heat generating component. As heat dissipation paths from the heat generating component to the heat dissipation frame, there are formed a first heat dissipation path via the thermally conductive member and a second heat dissipation path via the flexible printed circuit and the second substrate.

8 Claims, 7 Drawing Sheets

(52) U.S. Cl.
CPC ............... *H05K 1/14* (2013.01); *H05K 1/147* (2013.01); *H05K 7/20445* (2013.01); *H05K 1/0207* (2013.01); *H05K 2201/042* (2013.01); *H05K 2201/10151* (2013.01)

(58) Field of Classification Search
CPC .... H05K 7/20; H05K 7/2039; H05K 7/20545; H05K 7/20445; H05K 7/209; H05K 7/20454; H05K 2201/056; H05K 2201/066; H05K 2201/1056; H05K 2201/10151; H05K 2203/1572; H05K 3/0061; H01L 23/13; H01L 23/3121; H01L 23/32; H01L 23/3672; H04N 5/225; H04N 5/2252; H04N 5/2254; G03B 17/02; G03B 17/12; G03B 17/56
See application file for complete search history.

(56) References Cited

U.S. PATENT DOCUMENTS

| | | | |
|---|---|---|---|
| 2018/0031902 A1* | 2/2018 | Uchiyama | G02F 1/13452 |
| 2019/0163036 A1* | 5/2019 | Kamada | G03B 17/02 |
| 2019/0289175 A1* | 9/2019 | Hirota | B60W 40/08 |
| 2020/0196492 A1* | 6/2020 | Kim | H05K 7/20963 |
| 2021/0410268 A1* | 12/2021 | Moon | H05K 1/0203 |

\* cited by examiner

ELECTRONIC APPARATUS IMPROVED IN HEAT DISSIPATION EFFICIENCY OF HEAT GENERATING COMPONENT

BACKGROUND OF THE INVENTION

Field of the Invention

The present invention relates to a technique of heat dissipation of an electronic apparatus.

Description of the Related Art

Conventionally, in an electronic apparatus, such as a digital camera, along with improvement of functions thereof, the processing capabilities of various ICs, such as an image capturing device and a driver IC, are increased, whereby power consumption is increased. For this reason, it is required to reduce a local temperature rise of an exterior of the electronic apparatus due to heat generation of a heat generating component, such as an IC, and a temperature rise of an electronic component susceptible to heat.

As a technique for controlling the flow of heat in the electronic apparatus, Japanese Laid-Open Patent Publication (Kokai) No. 2016-82261 has proposed a digital camera provided with two heat dissipation paths. This camera includes, besides a first path for electrically connecting a first substrate having an image capturing device mounted thereon to a second substrate, a second path for dissipating heat to a metal casing. Heat generated from the image capturing device flows toward the metal casing through the second path, thereby reducing the temperature rise of the image capturing device while suppressing heat transfer to the second substrate having a heat generating component mounted thereon.

However, in Japanese Laid-Open Patent Publication (Kokai) No. 2016-82261, the second path is not required for controlling the operation of the image capturing device. So, there is a problem that size reduction of the electronic apparatus is obstructed by the second path newly provided for controlling the flow of heat.

SUMMARY OF THE INVENTION

The present invention provides an electronic apparatus that is improved in heat dissipation efficiency of a heat generating component while avoiding an increase in the size of the electronic apparatus.

The present invention provides an electronic apparatus including a first substrate having a heat generating component mounted thereon, a second substrate, a heat dissipation frame arranged opposed to and in contact with the second substrate, a flexible printed circuit that electrically connects the first substrate and the second substrate, and a thermally conductive member that is sandwiched between the heat generating component and the heat dissipation frame such that the flexible printed circuit is pressed against the heat generating component, and wherein as heat dissipation paths from the heat generating component to the heat dissipation frame, there are formed a first heat dissipation path from the heat generating component to the heat dissipation frame via the thermally conductive member and a second heat dissipation path from the heat generating component to the heat dissipation frame via the flexible printed circuit and the second substrate.

According to the present invention, it is possible to improve the heat dissipation efficiency of the heat generating component while avoiding the increase in the size of the electronic apparatus.

Further features of the present invention will become apparent from the following description of exemplary embodiments (with reference to the attached drawings).

DESCRIPTION OF THE EMBODIMENTS

The present invention will now be described in detail below with reference to the accompanying drawings showing an embodiment thereof.

Figure 1A:
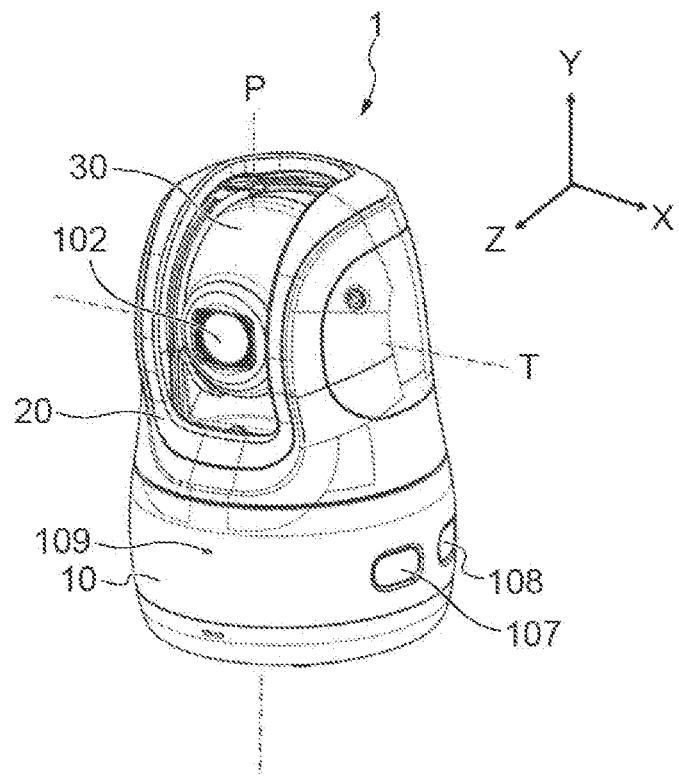
FIGS. 1A and 1B are perspective views of an electronic apparatus.
Figure 1B:
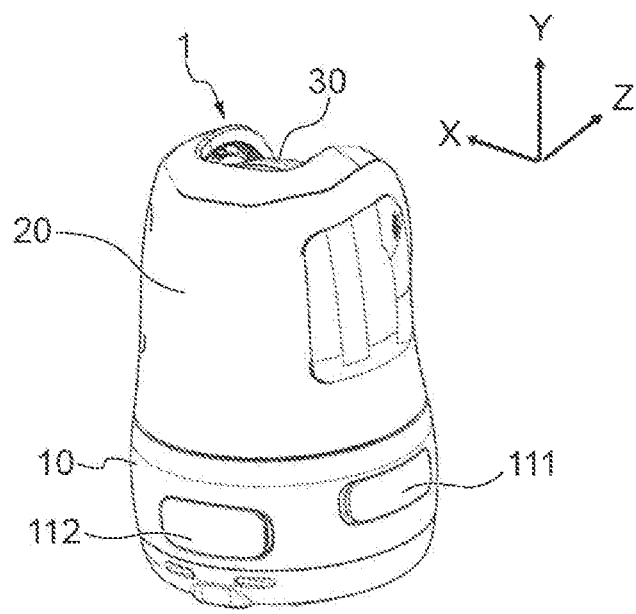
Figure 2:
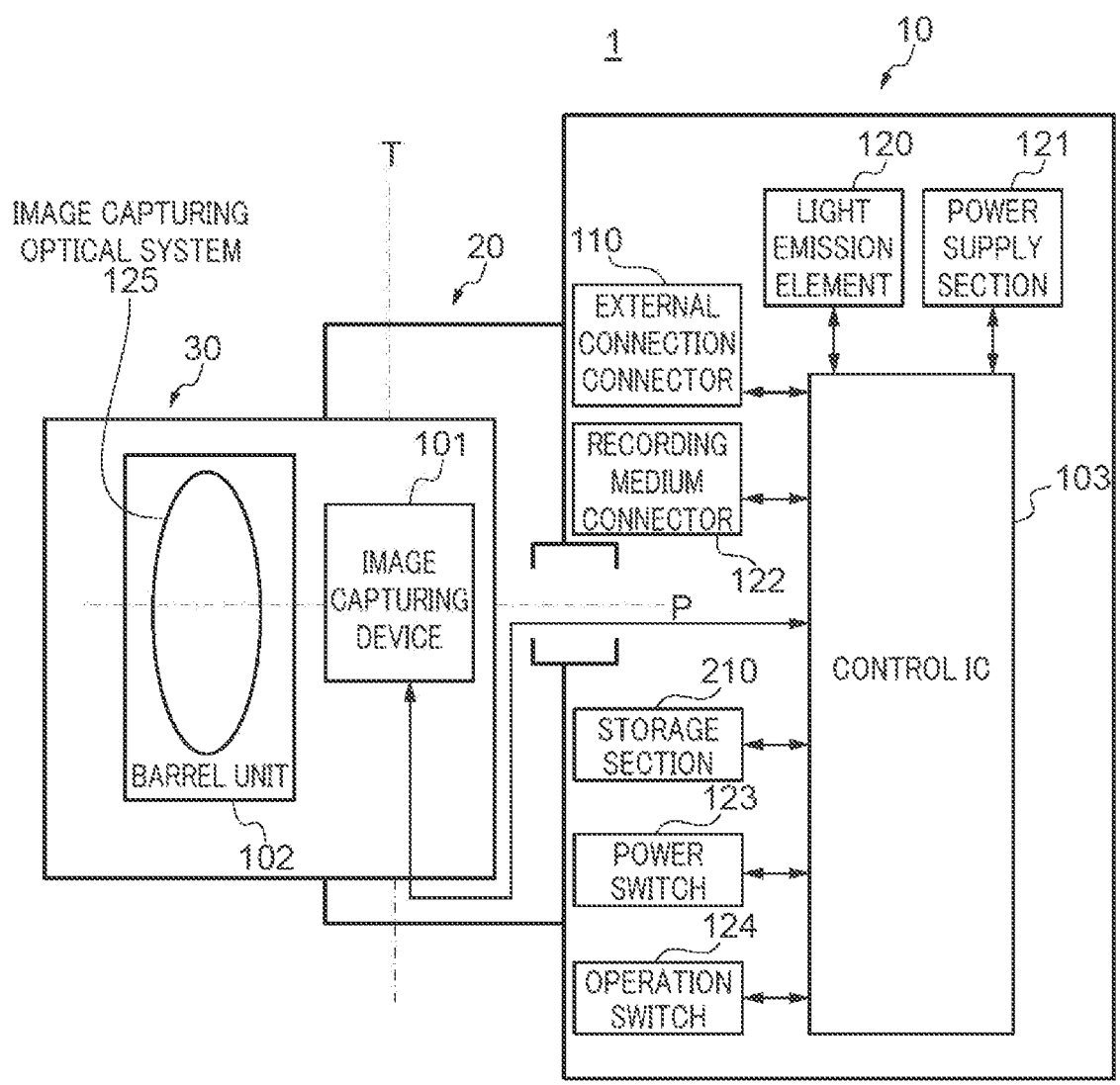
FIG. 2 is a block diagram of an image capturing apparatus.

FIGS. 1 A and 1B are perspective views of an electronic apparatus according to an embodiment of the present invention. As an example of the electronic apparatus, an image capturing apparatus 1 is shown. Particularly, FIGS. 1A and 1B are perspective views of the image capturing apparatus 1, as viewed from the front and the rear, respectively. FIG. 2 is a block diagram of the image capturing apparatus 1.

Hereafter, when components of the image capturing apparatus 1 are described, directions are referred to with reference to the X-axis, Y-axis, and Z-axis of the coordinate system shown in FIGS. 1A and 1B. An X-axis direction is a left-right direction of the image capturing apparatus 1, a Y-axis direction is a vertical direction of the image capturing apparatus 1, and a Z-axis direction is a front-rear direction of the image capturing apparatus 1. Particularly, a +Y-axis direction is the upward direction of the image capturing apparatus 1, a +Z-axis direction is the front direction of the image capturing apparatus 1, and a +X-axis direction is the left direction of the image capturing apparatus 1 as viewed in the front direction thereof. The X-axis, Y-axis and Z-axis directions are mainly used to refer to respective directions of a fixed section 10, described in detail hereinafter.

As shown in FIGS. 1A and 1B, the image capturing apparatus 1 is comprised of the fixed section 10, a first movable section 20, and a second movable section 30. The first movable section 20 is pivotally fixed to the fixed section 10 such that it is rotatable about a rotational axis P substantially parallel to the Y-axis. Further, the second movable section 30 is pivotally fixed to the first movable section 20 such that it is rotatable about a rotational axis T substantially orthogonal to the rotational axis P. In other words, the second movable section 30 is made pivotal with respect to the fixed section 10 with a two-axis degree of freedom, due to the pivotal motion of the first movable section 20 with respect to the fixed section 10 about the rotational axis P and the pivotal motion of the second movable section 30 with respect to the first movable section 20 about the rotational axis T.

A barrel unit 102 is fixed to the second movable section 30. Therefore, the image capturing apparatus 1 is configured to be capable of changing a shooting direction thereof with respect to the fixed section 10. The barrel unit 102 includes an image capturing device 101 (FIG. 2), such as a CCD or CMOS image sensor, which generates image data by photoelectrically converting an optical image, and an image capturing optical system 125 (FIG. 2) that causes an object image to be formed on the image capturing device 101.

A power button 107 and an operation button 108, both of which are push-button switches, are arranged on the left side of the fixed section 10. The front side of the fixed section 10 is provided with a display window 109. The right side of the fixed section 10 is provided with an external connection connector cover 111. The rear side of the fixed section 10 is provided with a recording medium connector cover 112.

As shown in FIG. 2, the fixed section 10 is comprised of a control IC 103, a power supply section 121, a light emission element 120, an external connection connector 110, a recording medium connector 122, a storage section 210, a power switch 123, and an operation switch 124. The light emission element 120 is formed e.g. by an LED. The storage section 210 stores a variety of software programs. The power supply section 121 supplies required electric power to the control IC 103, the image capturing device 101, and so forth. The fixed section 10 incorporates a main substrate 104 (first substrate) appearing in FIGS. 3A and 3B. The main substrate 104 has various processing circuits including the control IC 103 and the storage section 210 mounted thereon. The control IC 103 controls a function of processing image data generated by the image capturing device 101 and is in charge of various controls of the image capturing apparatus 1 (e.g. control related to image capturing). Image signals generated by the image capturing device 101 are transmitted to the main substrate 104 via a cable 106 appearing in FIGS. 3A and 3B.

The display window 109 appearing in FIG. 1A is a transparent or translucent member. The light emission element 120 is disposed at a location corresponding to the display window 109 inside the image capturing apparatus 1. It is possible to visually check a light emitting state of the light emission element 120, via the display window 109 from outside the image capturing apparatus 1. For example, when the image capturing apparatus 1 is recording a moving image, the light emission element 120 emits light, and a user visually checks the light emission from the light emission element 120 via the display window 109, whereby the user can recognize that the image capturing apparatus 1 is recording a moving image. Therefore, the display window 109 is arranged on the front side of the fixed section 10 by considering visibility from the user.

When the user presses the power button 107, the power switch 123 detects the operation. Then, in response to the detection, the image capturing apparatus 1 is switched from a power-off state to a power-on state or from the power-on state to the power-off state. Further, in the power-on state of the image capturing apparatus 1, when the user presses the operation button 108, the operation switch 124 detects the operation. Then, in response to the detection, the operating state of the image capturing apparatus 1 is switched.

The external connection connector cover 111 is a member for covering the external connection connector 110 (FIG. 2) to hide the same when the external connection connector 110 is not in use. The external connection connector cover 111 can be moved within a predetermined range with respect to the fixed section 10. By moving the external connection connector cover 111, it is possible to expose the external connection connector 110.

The recording medium connector cover 112 is a member for covering the recording medium connector 122 to hide the same. The recording medium connector cover 112 can be moved in a predetermined range with respect to the fixed section 10. By moving the recording medium connector cover 112 with respect to the fixed section 10, it is possible to expose the recording medium connector 122. By exposing the recording medium connector 122, the user can attach or remove a recording medium to or from the recording medium connector 122.

Figure 3A:
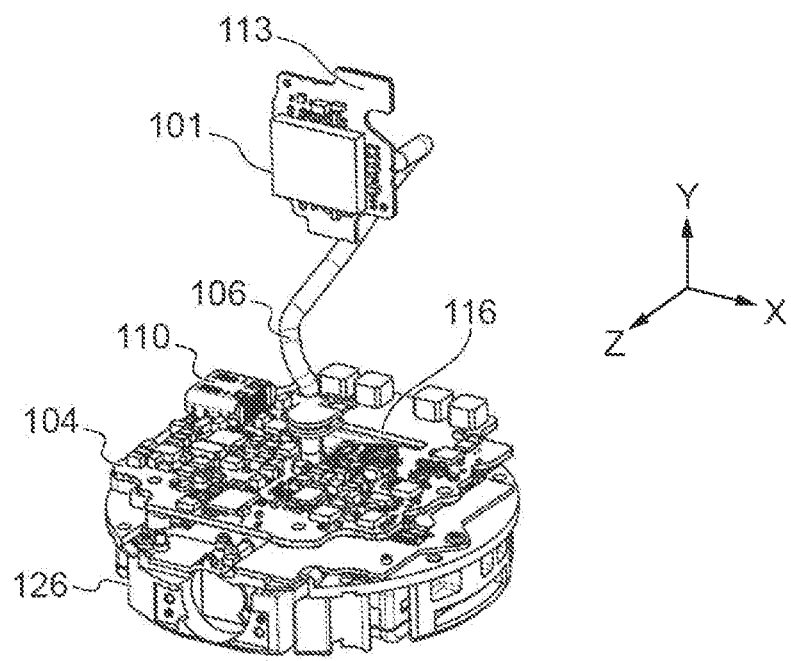
FIGS. 3A and 3B are perspective views of main components incorporated in the image capturing apparatus, as viewed from directions different from each other.
Figure 3B:
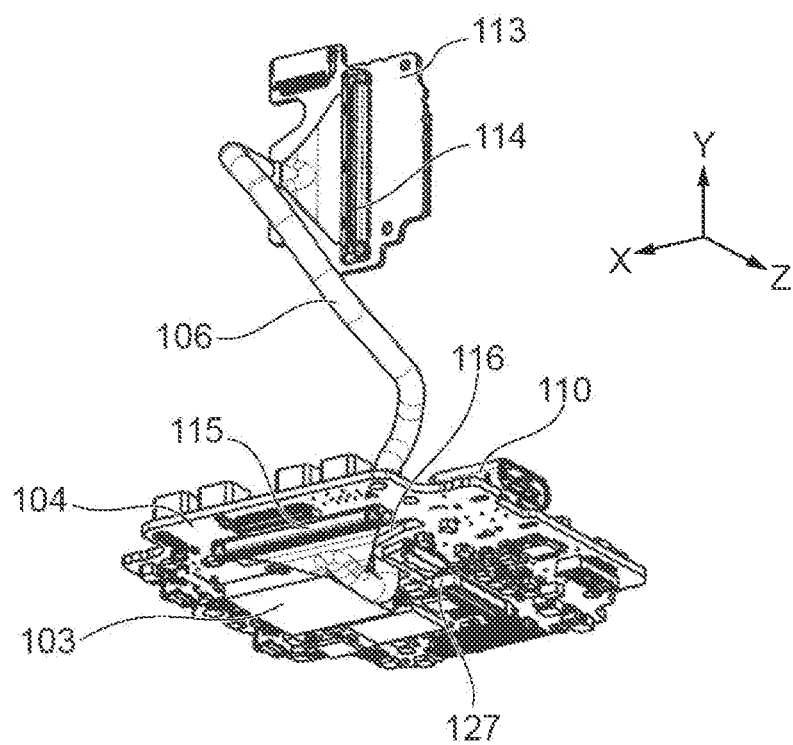

FIGS. 3A and 3B are perspective views of main components incorporated in the image capturing apparatus 1, as viewed from directions different from each other. A fixed section base unit 126 is arranged below the main substrate 104 in a state opposed thereto. In FIG. 3B, the fixed section base unit 126 is omitted from illustration.

On an image capturing device substrate 113 (third substrate), there are mounted the image capturing device 101 and a first connector 114. The image capturing device substrate 113 is fixed to the second movable section 30, and moves together with the second movable section 30 with respect to the fixed section 10. Since an excessive temperature rise of the image capturing device 101 causes an increase in the amount of image noise, the image capturing device 101 is an electronic component of which the temperature rise is required to be reduced as much as possible.

The main substrate 104 is fixed to the fixed section 10. The main substrate 104 has the control IC 103, the external connection connector 110, a second connector 115, and a third connector 127 mounted thereon. The main substrate 104 is formed with a main substrate hole 116 which is a through hole. The third connector 127 is a connector for connecting a flexible printed circuit 128 (appearing in FIGS. 4 to 7) to the main substrate 104.

The main substrate 104 and the image capturing device substrate 113 are electrically connected to each other by the cable 106. The cable 106 is a member for transmitting image signals generated by the mage capturing device 101 to the main substrate 104. One end of the cable 106 is connected to the first connector 114 of the image capturing device substrate 113, and the other end of the cable 106 is connected to the second connector 115 of the main substrate 104. Further, the cable 106 is inserted through the main substrate hole 116 of the main substrate 104.

The cable 106 has flexibility. Therefore, even if a relative positional relationship between the image capturing device substrate 113 and the main substrate 104 is changed by movement of the second movable section 30 with respect to the fixed section 10, the electrical connection between the image capturing device substrate 113 and the main substrate 104 via the cable 106 is maintained. The fixed section base unit 126 will be described hereinafter.

Figure 4:
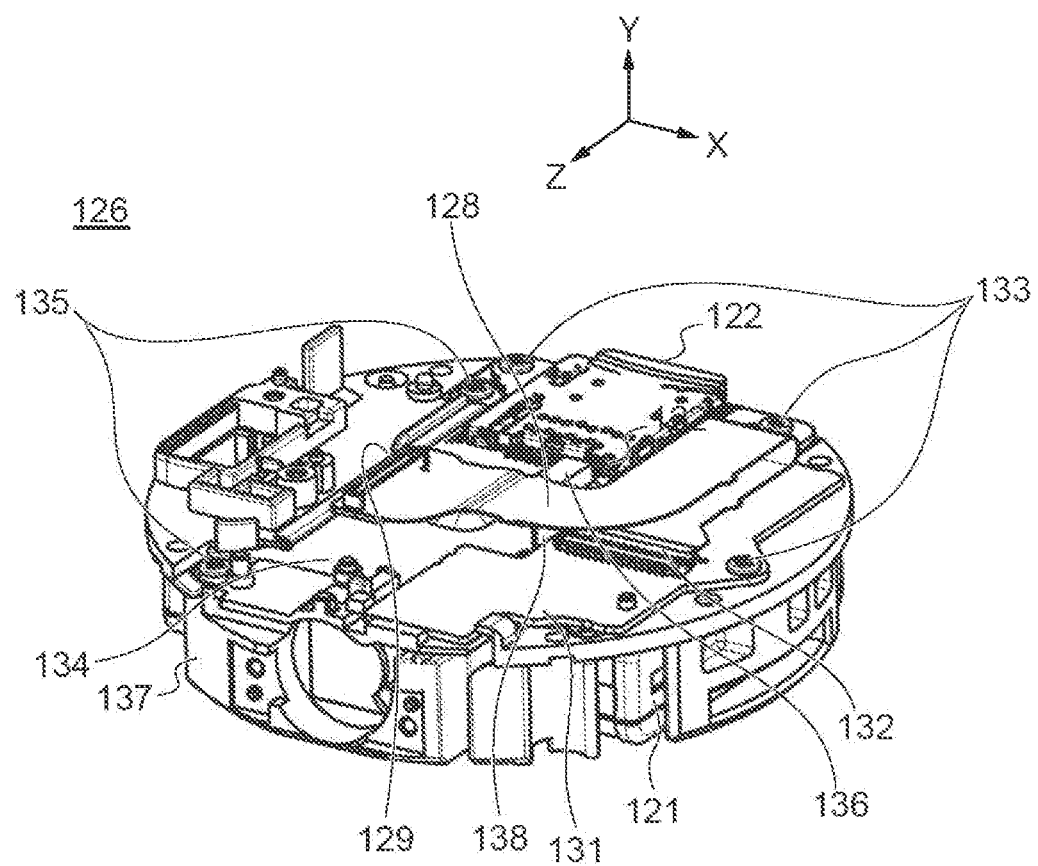
FIG. 4 is a perspective view of a fixed section base unit.
Figure 5:
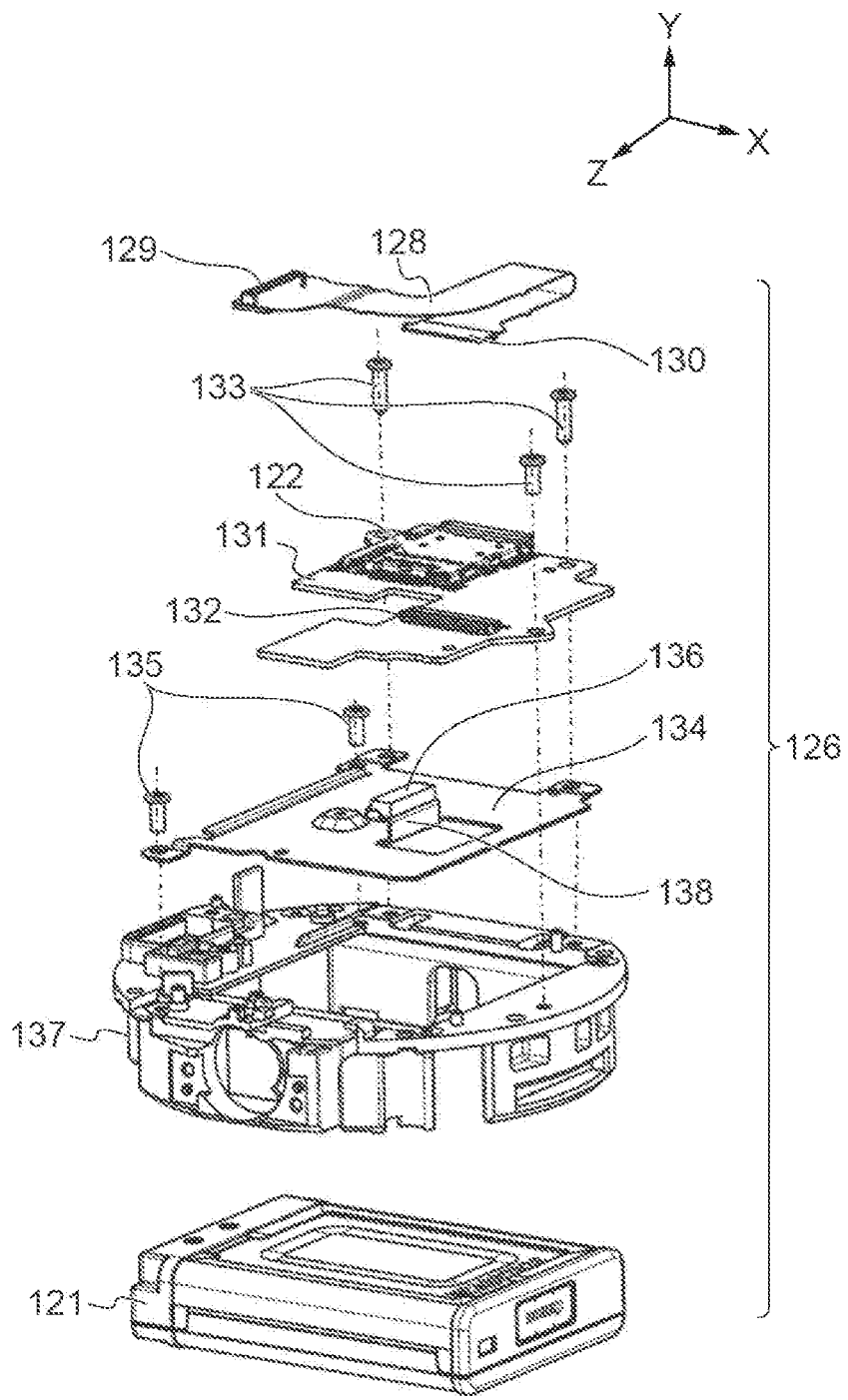
FIG. 5 is an exploded perspective view of the fixed section base unit.

FIG. 4 is a perspective view of the fixed section base unit 126. FIG. 5 is an exploded perspective view of the fixed section base unit 126.

The main components of the fixed section base unit 126 are a fixed section base 137, a heat dissipation frame 134, a connector substrate 131 (second substrate), and the flexible printed circuit 128. The fixed section base 137 accommodates the power supply section 121 which is a battery. The heat dissipation frame 134 and the connector substrate 131 are fixed to the fixed section base 137.

The control IC 103 appearing in FIGS. 2 and 3B controls not only the function for processing image data generated by the image capturing device 101 but also various operations of the image capturing apparatus 1. The control IC 103 is a main heat generating component with the highest power consumption of all electronic components of the image capturing apparatus 1. The heat dissipation frame 134 is a member for dissipating heat generated by the control IC 103, and is formed by a plate made of a metal material with high thermoelectric power. The heat dissipation frame 134 is integrally formed with a base 138. The base 138 is erected in the +Y-axis direction. A thermally conductive member 136 is placed on the base 138. The thermally conductive member 136 is formed of a rubber material having thermal conductivity and elasticity. The action of the thermally conductive member 136 will be described hereinafter. The heat dissipation frame 134 is fastened to the fixed section base 137 with screws 135.

The connector substrate 131 has the recording medium connector 122 and a fifth connector 132 mounted thereon. The connector substrate 131 is fastened to the fixed section base 137 with screws 133. In a state in which the connector substrate 131 is fastened to the fixed section base 137, the heat dissipation frame 134 is located between the connector substrate 131 and the fixed section base 137, and is also opposed to the connector substrate 131. At least a portion of the connector substrate 131 and a portion of the heat dissipation frame 134 are in contact with each other. This makes it easy for heat to flow from the connector substrate 131 to the heat dissipation frame 134 via the portions in contact of the two.

The flexible printed circuit 128 electrically connects the connector substrate 131 and the main substrate 104. Therefore, the flexible printed circuit 128 is formed with a pattern wiring 128a (see FIG. 6B) made of a conductive material, such as metal, so as to exchange electrical signals between the connector substrate 131 and the main substrate 104. Here, the conductive material forming the pattern wiring 128a is a material having excellent thermal conductivity, such as silver or copper. Therefore, the flexible printed circuit 128 is suitable also for transferring heat generated by the control IC 103 to the connector substrate 131. The heat transfer by the flexible printed circuit 128 will be described hereinafter.

As shown in FIG. 5, one end of the flexible printed circuit 128 is formed with a terminal section 130 for connecting to the fifth connector 132 on the connector substrate 131. A fourth connector 129 for connecting to the third connector 127 (see FIG. 3B) on the main substrate 104 is mounted on the other end of the flexible printed circuit 128.

Figure 6A:
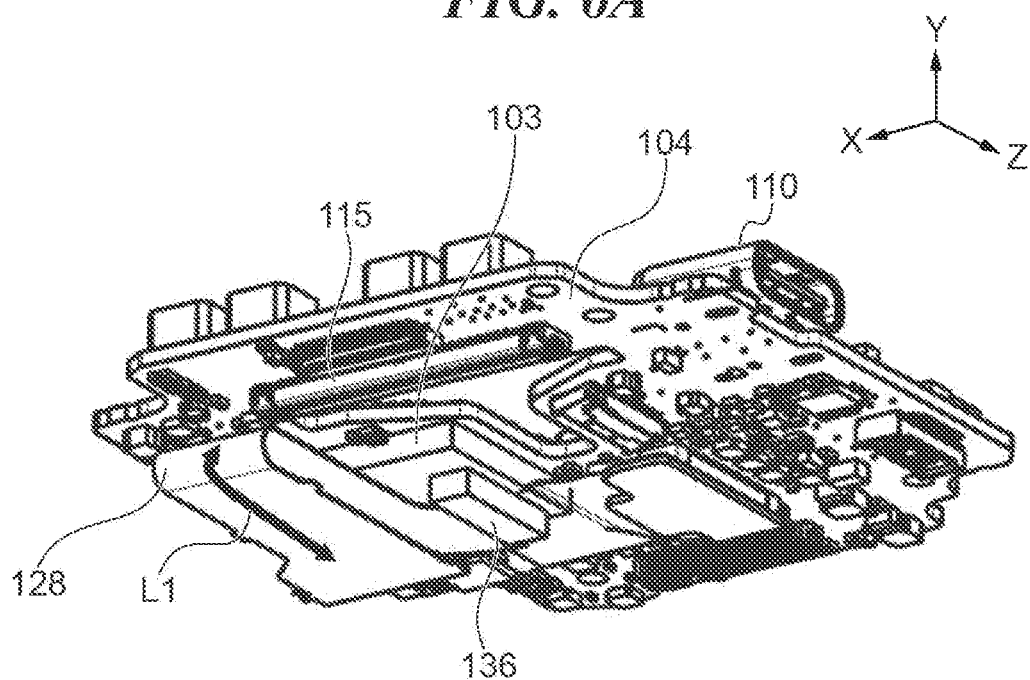
FIGS. 6A and 6B are perspective views of a main substrate, as viewed from directions different from each other.
Figure 6B:
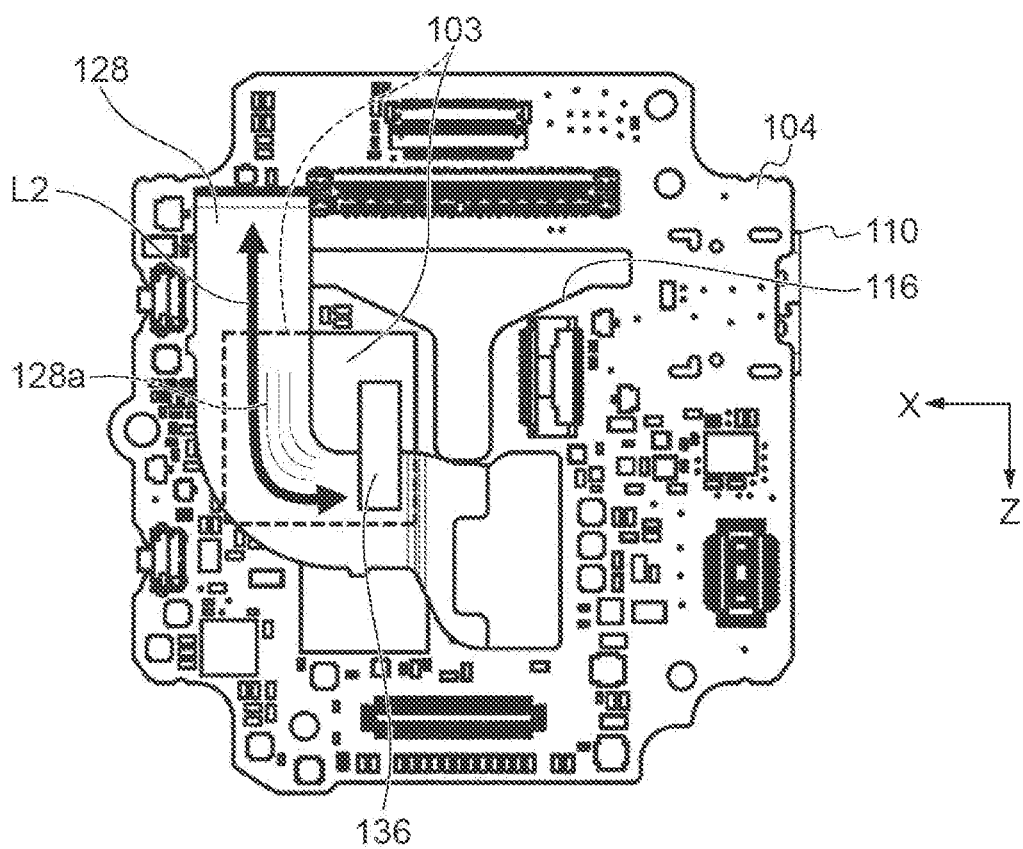
Figure 7:
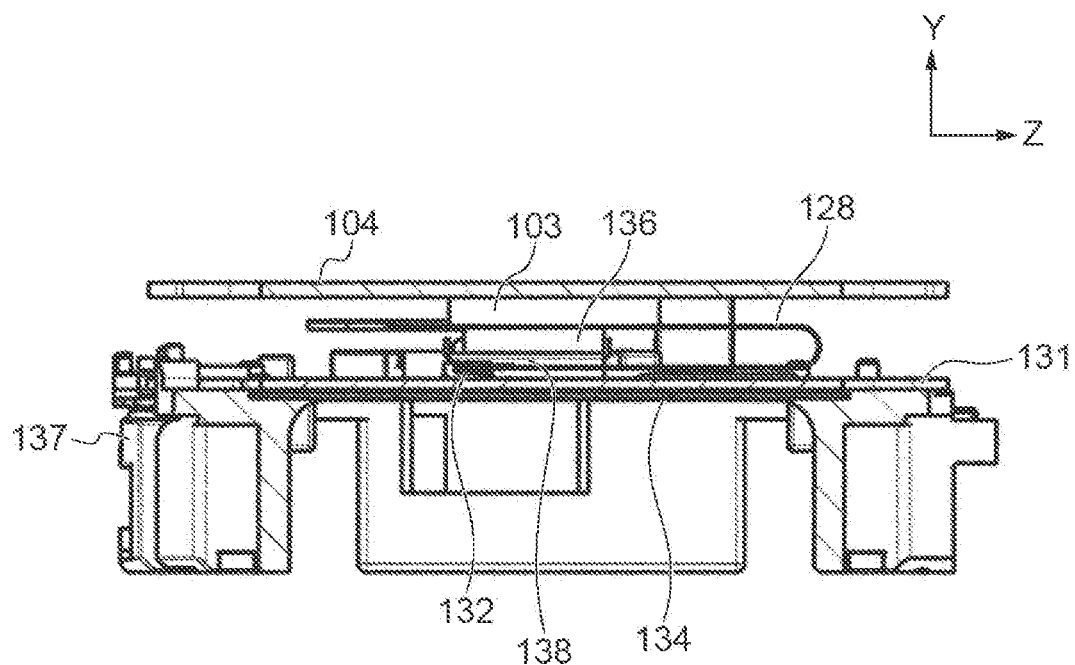
FIG. 7 is a cross-sectional view of essential parts of the fixed section base unit.

FIGS. 6A and 6B are perspective views of the main substrate 104, as viewed from directions different from each other. In FIG. 6B, part of the control IC 103, hidden by the flexible printed circuit 128, is indicated by a broken line. Further, in FIG. 6B, a portion of a −Y-axis side folded portion of the flexible printed circuit 128 is omitted from illustration. FIG. 7 is a cross-sectional view of essential parts of the fixed section base unit 126. The flow of heat in the image capturing apparatus 1 will be described with reference to FIGS. 6A and 6B and FIG. 7. With reference to FIGS. 6A and 6B, a positional relationship between the control IC 103, the thermally conductive member 136, and the flexible printed circuit 128 is mainly described. With reference to FIG. 7, a positional relationship between the control IC 103, the thermally conductive member 136, the flexible printed circuit 128, the connector substrate 131, and the heat dissipation frame 134 is mainly described.

As shown in FIGS. 6A and 6B and FIG. 7, the thermally conductive member 136 is sandwiched and held between the control IC 103 and the base 138 of the heat dissipation frame 134. The thermally conductive member 136 is arranged such that the flexible printed circuit 128 is pressed against the control IC 103. Therefore, the flexible printed circuit 128 is in contact with the control IC 103. In other words, a portion of the thermally conductive member 136 is in direct contact with the control IC 103. Further, another portion of the thermally conductive member 136 is in contact with the control IC 103 via the flexible printed circuit 128.

With this configuration, two heat dissipation paths, i.e. a first heat dissipation path and a second heat dissipation path are formed as heat dissipation paths from the control IC 103 to the heat dissipation frame 134. The first heat dissipation path is a path from the control IC 103 to the heat dissipation frame 134 via the thermally conductive member 136. The first heat dissipation path includes the portion of the thermally conductive member 136, which is in direct contact with the control IC 103. The second heat dissipation path extends from the control IC 103 to the heat dissipation frame 134 via the flexible printed circuit 128, the terminal section 130, the fifth connector 132 (FIG. 5), and the connector substrate 131. The second heat dissipation path includes a portion of the flexible printed circuit 128, which is pressed against the control IC 103.

A wiring direction of the pattern wiring 128a on the flexible printed circuit 128 is a direction connecting the fourth connector 129 and the terminal section 130, and as schematically indicated by arrows in FIGS. 6A and 6B, a direction L1 and a direction L2 correspond to the wiring direction. The direction of the pattern wiring 128a substantially matches a direction of the flow of heat on the flexible printed circuit 128 in the second heat dissipation path. Therefore, by heat dissipation via the second heat dissipation path, it is possible to efficiently transfer heat from the control IC 103 to the heat dissipation frame 134.

Incidentally, in general, the flexible printed circuit is formed with a member called a cover lay for covering the pattern wiring. The cover lay is formed of an insulating material having a relatively low thermal conductivity. In the present embodiment, the flexible printed circuit 128 is configured such that a portion of the pattern wiring 128a thereof is exposed so as to be brought into direct contact with the control IC 103. More specifically, the pattern wiring 128a is exposed by removing a portion of the cover lay corresponding to the portion of the flexible printed circuit 128, which is pressed against the control IC 103 by the thermally conductive member 136 so as to be brought into contact with the control IC 103. The exposed portion of the pattern wiring 128a is in contact with the control IC 103. With this, it is possible to more efficiently transfer heat from the control IC 103 to the flexible printed circuit 128.

As described hereinabove, the control IC 103 is the main heat generating component. On the other hand, the image capturing device 101 is another heat generating component different from the control IC 103, and is an electronic component of which the temperature rise is desired to be suppressed as much as possible. Out of the heat generated from the control IC 103, heat having flowed to the second connector 115 flows from the second connector 115 to the cable 106, the first connector 114, and the image capturing device substrate 113 (FIG. 3B). Therefore, if the heat generated from the control IC 103 flows too much to the second connector 115, it causes an excessive temperature rise of the image capturing device 101 mounted on the image capturing device substrate 113. Further, since the external connection connector 110 is a member which can be directly touched by the user, there is a fear that its excessive temperature rise gives an uncomfortable feeling to the user. For this reason, it is desirable to reduce as much as possible the amount of heat flowing from the control IC 103, which generates the heat, to the second connector 115 and the external connection connector 110.

From these points of view, the image capturing device substrate 113 is arranged on an opposite side (+Y-axis side) of the main substrate 104 to the heat dissipation frame 134. With this, since the heat generated by the control IC 103 is mainly dissipated to the heat dissipation frame 134 arranged on an opposite side of the main substrate 104 to the image capturing device substrate 113, the amount of heat that flows to the second connector 115 and the external connection connector 110 is reduced. What is more, the control IC 103 is mounted on a surface of the main substrate 104, which is opposed to the heat dissipation frame 134. That is, the control IC 103 is mounted on a side of the main substrate 104, on which the heat dissipation frame 134 is arranged. With this, the distance between the image capturing device substrate 113 and the control IC 103 becomes longer, so that heat transfer from the control IC 103 to the image capturing device substrate 113 is suppressed, whereas the heat transfer from the control IC 103 to the heat dissipation frame 134 is promoted.

According to the present embodiment, since the two heat dissipation paths, i.e. the first and second heat dissipation paths are formed as the heat dissipation paths from the control IC 103 to the heat dissipation frame 134, it is possible to effectively dissipate heat from the control IC 103 to the heat dissipation frame 134. To provide the second heat dissipation path, the flexible printed circuit 128 is used which is also used for controlling operation of the image capturing device, and hence there is no need to provide a new component only to control the flow of heat, so that the size reduction of the apparatus is not obstructed. Thus, it is possible to improve the heat dissipation efficiency of the heat generating component while avoiding an increase in the size of the image capturing apparatus.

What is more, the thermally conductive member 136, which presses the flexible printed circuit 128 against the control IC 103 so as to provide the second heat dissipation path, is also involved in formation of the first heat dissipation path, and hence reduction of the number of components is achieved with a simple configuration, which also contributes to the size reduction of the image capturing apparatus.

Further, since in the first heat dissipation path, the thermally conductive member 136 is in direct contact with the control IC 103, a high heat dissipation effect can be obtained by the first heat dissipation path.

Further, the direction in which the pattern wiring 128a of the flexible printed circuit 128 is formed substantially matches the direction of the flow of heat on the flexible printed circuit 128 in the second heat dissipation path. What is more, the exposed portion of the pattern wiring 128a of the flexible printed circuit 128 is in direct contact with the control IC 103. With these, in the second heat dissipation path, the efficiency of heat dissipation from the control IC 103 to the heat dissipation frame 134 is improved.

Further, since the image capturing device substrate 113 is arranged on the opposite side (+Y-axis side) of the main substrate 104 to the heat dissipation frame 134, the amount of heat that flows to the second connector 115 and the external connection connector 110 is reduced. Therefore, it is possible to suppress the excessive temperature rise of the image capturing device 101.

Furthermore, since the control IC 103 is mounted on the surface of the main substrate 104, which is opposed to the heat dissipation frame 134, the distance between the image capturing device substrate 113 and the control IC 103 becomes larger. This suppresses the heat transfer from the control IC 103 to the image capturing device substrate 113, and improves the efficiency of heat dissipation from the control IC 103 to the heat dissipation frame 134.

Note that in the first heat dissipation path, the thermally conductive member 136 is not necessarily required to be in direct contact with the control IC 103, but the first heat dissipation path may be formed via a portion in indirect contact with the control IC 103.

Note that the present invention can be applied not only to electronic apparatuses having an image capturing function but also to various types of electronic apparatuses having heat generating components.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-126451, filed Jul. 27, 2020, which is hereby incorporated by reference herein in its entirety.

What is claimed is:

1. An electronic apparatus comprising:
    a first substrate having a heat generating component mounted thereon;
    a second substrate;
    a heat dissipation frame arranged opposed to and in contact with the second substrate;
    a flexible printed circuit that electrically connects the first substrate and the second substrate; and
    a thermally conductive member that is sandwiched between the heat generating component and the heat dissipation frame such that the flexible printed circuit is pressed against the heat generating component, and
    wherein as heat dissipation paths from the heat generating component to the heat dissipation frame, there are formed a first heat dissipation path from the heat generating component to the heat dissipation frame via the thermally conductive member and a second heat dissipation path from the heat generating component to the heat dissipation frame via the flexible printed circuit and the second substrate.

2. The electronic apparatus according to claim 1, wherein the flexible printed circuit includes a pattern wiring that exchanges electrical signals between the first substrate and the second substrate, and
    wherein a direction of flow of heat on the flexible printed circuit in the second heat dissipation path and a direction in which the pattern wiring is formed substantially matches.

3. The electronic apparatus according to claim 1, wherein a portion of the thermally conductive member is in direct contact with the heat generating component, and
    wherein another portion of the thermally conductive member is in contact with the heat generating component via the flexible printed circuit.

4. The electronic apparatus according to claim 1, further comprising a third substrate having another heat generating component different from the heat generating component mounted thereon, and
    wherein the third substrate is arranged on an opposite side of the first substrate to the heat dissipation frame.

5. The electronic apparatus according to claim 4, wherein the other heat generating component is an image capturing device.

6. The electronic apparatus according to claim 1, wherein the heat generating component is mounted on a surface of the first substrate, which is opposed to the heat dissipation frame.

7. The electronic apparatus according to claim 1, wherein the flexible printed circuit includes a pattern wiring that exchanges electrical signals between the first substrate and the second substrate, and
   wherein a portion of the pattern wiring is brought into direct contact with the heat generating component by the flexible printed circuit being pressed against the heat generating component by the thermally conductive member.

8. The electronic apparatus according to claim 1, wherein the electronic apparatus has an image capturing function, and
   wherein the heat generating component is an electronic component that performs at least control related to image capturing.

\* \* \* \* \*